United States Patent [19]

Kiani et al.

[11] Patent Number: 5,399,922
[45] Date of Patent: Mar. 21, 1995

[54] MACROCELL COMPRISED OF TWO LOOK-UP TABLES AND TWO FLIP-FLOPS

[75] Inventors: Khusrow Kiani, Oakland; Janusz K. Balicki, San Jose; Behzad Nouban, Fremont; Ken Li, Santa Clara, all of Calif.

[73] Assignee: Altera Corporation, San Jose, Calif.

[21] Appl. No.: 86,420

[22] Filed: Jul. 2, 1993

[51] Int. Cl.⁶ .......................................... H03K 19/177
[52] U.S. Cl. .......................................... 326/40; 326/21
[58] Field of Search ................. 307/465, 465.1, 443, 307/465, 465.1

[56] References Cited

U.S. PATENT DOCUMENTS

| | | | |
|---|---|---|---|
| 4,758,746 | 7/1988 | Birkner et al. | 307/465 |
| 4,894,563 | 1/1990 | Gudger | 307/465 |
| 4,912,345 | 3/1990 | Steele et al. | 307/465 |
| 4,963,770 | 10/1990 | Keida | 307/465 |
| 5,003,204 | 3/1991 | Cushing et al. | 307/465 |
| 5,027,011 | 6/1991 | Steele | 307/465 |
| 5,136,188 | 8/1992 | Ha et al. | 307/465 |
| 5,191,243 | 3/1993 | Shen et al. | 307/465 |
| 5,317,698 | 5/1994 | Chan | 340/825.83 |

FOREIGN PATENT DOCUMENTS 2130023  5/1990  Japan .................................. 307/465

OTHER PUBLICATIONS

*Optimized Reconfigurable Cell Array (ORCA) Series Field-Programmable Gate Arrays*, AT&T Microelectronics Advance Data Sheet, Feb. 1993 (pp. 1-32).

Primary Examiner—Edward P. Westin
Assistant Examiner—Benjamin D. Driscoll
Attorney, Agent, or Firm—Townsend and Townsend Khourie and Crew

[57] ABSTRACT

A macrocell for use in a programmable logic device (PLD) providing for enhanced logic capability and reduced setup time. The preferred embodiment of the macrocell includes two look-up tables, for increased fan-in, and two flip-flops that increase fan-out, thereby doubling logic capability of the PLD without unacceptably increasing device size. Doubling the register count makes this PLD particularly suitable for applications employing high density sequential logic. Furthermore, a second register can be used for receiving fast input signals form an input to the PLD to reduce setup time.

9 Claims, 1 Drawing Sheet

MACROCELL COMPRISED OF TWO LOOK-UP TABLES AND TWO FLIP-FLOPS

BACKGROUND OF THE INVENTION

The present invention relates generally to a logic module or macrocell for use in programmable logic devices. More particularly, the present invention provides a highly flexible and fast macrocell with enhanced logic capability.

The fundamental building block of a PLD is a macrocell. Each macrocell is capable of performing limited logic functions on a number of input variables. Broadly, a macrocell includes a programmable AND array whose output terms feed a fixed OR array to implement the "sum of products" logic. When combined together in large numbers inside a PLD, macrocells facilitate implementation of complex combinatorial as well as sequential logic.

One approach to implementing a macrocell utilizes a programmable memory structure that includes architecture bits for storing information corresponding to a desired logic configuration. The memory structure is then connected to a look-up table that implements any logical function of its several input variables. To be able to perform sequential logic, the output of the look-up table also feeds an input of a configurable register. A macrocell thus constructed offers advantages in speed, density, programming flexibility, and manufacturing ease. However, there is always room for improvement in terms of logic capability and speed performance.

A macrocell can be designed with as many logic inputs as required by the logic operations. Complex logic operations tend to require a high number of input variables. Thus, increasing the fan-in of a macrocell enhances its logic capability. However, a linear increase in the fan-in of a look-up table results in a geometric increase in the number of programmable architecture bits required to implement the look-up table. For example, a 4-input programmable look-up table requires 16 ($2^4$) programmable architecture bits to implement any 4-variable logic function. An 8-input programmable look-up table requires 256 ($2^8$) programmable architecture bits to implement any 8-variable logic function.

From the manufacturing perspective, a greater number of programmable architecture bits per macrocell means higher circuit density and lower yield. In practical terms, this circuit density constraint places an upper limit on the number of programmable architecture bits and consequently the look-up table fan-in. Thus, while designers have always searched for ways to increase the logic capability of PLDs, one challenge has been to balance the macrocell fan-in against this circuit density constraint.

A successful method of increasing the logic capability of PLDs while keeping circuit density within acceptable levels is disclosed in a commonly-assigned U.S. patent application, Ser. No. 08/049,064 (Attorney Docket No. 15114-369), which is hereby incorporated by reference in its entirety, and the references cited therein. There, it was recognized that while cascading multiple macrocells together increases the number of input variables, it results in inefficient use of circuitry in a PLD. Therefore, logic capability of each macrocell was increased by including more than one look-up table in each macrocell. The outputs of the plurality of look-up tables were logically combined inside each macrocell, enabling it to perform more complex logic operations involving larger number of variables.

While this technique improves the capability of a macrocell to perform more complex combinatorial logic, registered (or sequential) logic capacity and speed performance of the PLD remain unaffected. Register count of a PLD is important for high density register mode applications, while speed is especially critical in applications using sequential logic where setup time can be a limiting factor. Setup time refers to the time it takes an input data to propagate from the input pin on the chip to the input of the first clocked register inside a macrocell.

Simply increasing the number of macrocells in a PLD to obtain a larger register count for high density register mode applications may result in unacceptably large die sizes. Silicon area considerations place an upper limit on the number of macrocells and thus the number of registers available for existing PLDs.

For a typical macrocell, in order for the input signal to reach the input of a clocked register, it must first propagate through the look-up table or product term logic. Furthermore, typical PLD architectures require the input signal to first connect to some type of global interconnect network, go through a selection logic and cross a local array of macrocells before it arrives at an input of a particular macrocell. Therefore, the total signal propagation delay includes the delay associated with the heavily loaded global interconnect lines, gate delays through the selection logic (e.g. multiplexers), delay through the interconnect line crossing the local macrocell array, and delay associated with the macrocell logic. This propagation delay can be as high as, for example, 10 nanoseconds.

From the foregoing, it can be appreciated that there is a need for a macrocell with improved logic capability that provides for larger register count and a fast setup time in programmable logic devices with comparable die sizes.

SUMMARY OF THE INVENTION

The present invention provides a highly flexible macrocell with improved registered logic capability and reduced setup time for use in programmable logic devices. The macrocell uses a plurality of programmable look-up tables to increase macrocell fan-ins, and a plurality of configurable registers to increase register count (fan-out) and reduce setup time, while maintaining comparable device size.

According to one embodiment, the present invention provides, in a programmable logic device (PLD), a macrocell having several inputs and at least one output. The macrocell employs at least one programmable logic circuit with several inputs connected to the several macrocell inputs and an output; and a programmable logic means, responsive to the output of the at least one programmable logic circuit, to an output of another macrocell and to an input signal to the PLD. The macrocell programmably produces a logical combination of its inputs at at least one output. The macrocell further includes output control means, connected to the output of the programmable logic means and responsive to control signals external to the macrocell, for outputting the output of the programmable logic means at an output connected to the at least one output of the macrocell.

In another embodiment, the macrocell of the present invention includes two programmable multi-input look-up tables whose outputs feed into inputs of two NAND gates with programmable inputs. Other inputs of the NAND gates connect to an output from another macrocell as well as a buffered input signal coming directly from an input pad. The outputs of the NAND gates connect to two configurable flip-flops, respectively. Two outputs of the two flip-flops as well as the two outputs of the NAND gates feed a 4:2 multiplexer. The multiplexer selects two of its four inputs as the two outputs of the macrocell.

In one mode, the macrocell of the second embodiment is capable of providing, at one output, the results of complex logic functions performed on an extended number of variables, while providing a clocked (i.e. synchronized) input signal directly from an input pad at a second output. In another modes the macrocell can provide two independent combinatorial or registered outputs, essentially acting as a dual logic module. The macrocell of the present invention, therefore, enjoys enhanced logic capability, is very flexible and provides for reduced setup time.

A further understanding of the nature and advantages of the macrocell of the present invention may be gained with reference to the description and diagrams below.

DESCRIPTION OF THE PREFERRED EMBODIMENT

Figure 1:
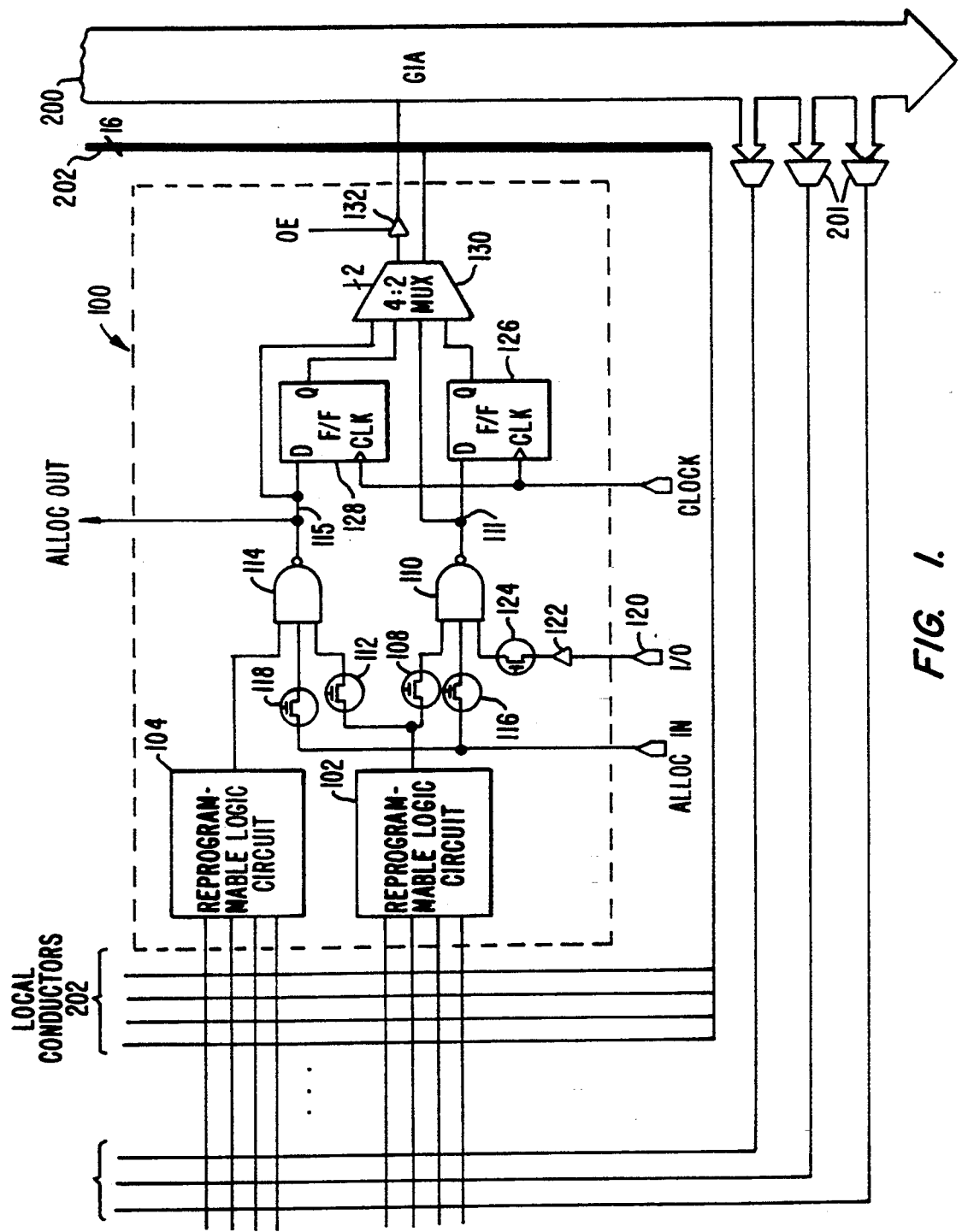
FIG. 1 is a circuit schematic of a macrocell according to an embodiment of the present invention.

FIG. 1 is a circuit schematic of a macrocell 100 that provides for improved registered logic capability and reduced setup time, according to one embodiment of the present invention. A typical PLD in which macrocell 100 is used is divided into numerous logic array blocks, with each logic array block made up of a number of (e.g. eight or sixteen) macrocells 100. A global interconnect array (GIA) 200 is utilized as a central interconnection mechanism for communication between I/O pads and the several macrocells 100. Selected GIA 200 lines are routed to each logic array block through multiplexers 201. Additionally, outputs of macrocells within each logic array block connect to local conductors 202 to provide for local feedback among the several macrocells. Therefore, inputs to macrocell 100 comprise conductors from the GIA 200 and local conductors 202.

Macrocell 100 includes two programmable logic circuits 102 and 104. Each one of the programmable logic circuits includes several (e.g. four) inputs and programmably implements a sum of products logic of its various inputs. These inputs selectably connect to local conductors 202 or selected conductors from the GIA 200. An output of logic circuit 102 connects to one input of a three-input NAND gate 110 via a programmable element 108. Output of logic circuit 102 also connects to an input of another three-input NAND gate 114 via a programmable element 112. An allocation input signal connects to a second input of each of NAND 110 and NAND 114 through programmable elements 116 and 118, respectively. The allocation input signal is an output of a preceding macrocell and enables the PLD to perform more complex logic by cascading several macrocells. A third input of NAND 114 connects directly to an output of programmable logic circuit 104. An input signal 120 coming directly form an I/O pad (not shown) is buffered by a buffer 122 and connects to a third input of NAND 110 via a programmable element 124. The outputs 111 and 115 of the two NAND gates 110 and 114 connect to inputs of two flip-flops 126 and 128, respectively. A 4:2 multiplexer MUX 130 receives NAND gate outputs 111 and 115 as well as outputs of flip-flops 126 and 128 at its four inputs, respectively. Two outputs of MUX 130 constitute the outputs of macrocell 100. While one output, via a tristate buffer 132, connects to an I/O pad through GIA 200, the other output connects to one of local conductors 202. Output 115 of NAND 114 is used as an allocation output signal from macrocell 100, and tristate buffer 132 is controlled by an output enable (OE) signal.

Programmable elements 108, 112, 116, 118 and 124 can be implemented by any volatile or non-volatile memory cell (e.g. EPROM or RAM), or any type of fusible link. An example of programmable logic circuits 102 and 104 is a four-input programmable look-up table that can produce at its output any logical function of its four inputs.

The enhanced logic capability, increased speed and overall flexibility of macrocell 100 can best be appreciated by considering the options provided at NAND gates 112 and 114 outputs 111 and 115. Output 115 of NAND 114 provides one of three options. First, by turning off programming elements 118 and 112, NAND 114 will be responsive only to logic circuit 104. In combination with flip-flop 128, logic circuit 104 constitutes an independent four-variable logic module, functionally separate from the other logic circuit 102 and flip-flop 126. This allows the other half of the macrocell 100 to be utilized for other functions.

To increase the logic capability of the macrocell, programming element 112 can be turned on. This will connect the output of logic circuit 102 to another input of NAND 114, increasing the fan-in of macrocell 100. Macrocell 100 is thus capable of performing logic functions with eight variables. Further enhancement to logic capability of macrocell 100 is made possible by turning on programming element 118. This permits cascading of several macrocells and allows for implementation of highly complex logic functions. Output 115 of NAND 114 is also made available as an allocation output of macrocell 100 to facilitate cascading with other macrocells. A registered version of output 115 in any of these modes is provided through flip-flop 128. That is, MUX 130 can be programmed to output: either the signal on 115 directly or the clocked version of it at the output of flip-flop 128.

Even when the enhanced logic capability of macrocell 100 is fully utilized (i.e. both logic circuits, allocation input as well as flip-flop 128 combined), flip-flop 126 remains independently available for receipt of input signals. By turning off programming elements 108 and 116, and turning on programming element 124, NAND 110 becomes responsive to I/O input 120 only. Buffer 122 adjusts the threshold level of the signal at input 120 and feeds it to an input of NAND 110 through programmable element 124. Input signal 120 is thus made available, for example, for synchronization with a particular signal on the clock input of flip-flop 126.

It is in this mode that a much reduced setup time can be obtained. When it is desired to reduce setup time, the PLD can route a fast input conductor from an I/O pad directly to a macrocell input 120. This way the input signal will not experience delays associated with the heavily loaded GIA 200 interconnect lines, delay through multiplexers 201, delay through logic array block conductor lines and delay through the macrocell logic circuit. Typically, a reduction in setup time from about 10 nanoseconds to around only 2 nanoseconds can be achieved by the macrocell of the present invention.

Therefore, the macrocell of the present invention, when fully utilized, can provide at one output, a logic function of eight variables cascaded with another macrocell output and registered, while at the same time can set up an input signal at another output.

The additional flip-flop per macrocell doubles the total number of registers as compared to typical PLDs. This has been achieved without requiring a doubling of the size of the device. The incremental increase in size due to an addition of a register to an existing macrocell is significantly less than that caused when addition of an extra register requires adding a whole new macrocell.

The double register feature of the present invention thus increases the fan-out of the macrocell when programming one look-up table per flip-flop. In this mode, the macrocell of the present invention provides the logic capabilities of essentially two independent registered macrocells. Therefore, a PLD using the macrocell of the present invention is particularly suited for register intensive applications requiring high density, sequential logic. Furthermore, implementation of testability according to the standards set by the Institute of Electrical and Electronics Engineers (IEEE), typically require a state machine that employs several registers. A greater number of flip-flops, therefore, enable the PLD to implement on-board testability that conform to the IEEE observability and controllability standards.

In conclusion, the present invention offers a macrocell for use in a PLD that provides for greater combinatorial and registered logic capability as well as reduced setup time. While the above is a complete description of the preferred embodiment of the present invention, it is possible to use various alternatives, modifications and equivalents. For example, the option of using a flip-flop to directly receive an input signal can be provided in a macrocell that employs only one logic circuit (e.g. only one look-up table). In that case, while the macrocell would provide for a reduced setup time, its fan-in would be limited to four inputs. Also, other types of gates or logic blocks (e.g. a third look-up table) can be used in place of NAND gates 114 and 110 to logically Combine the programmable logic circuit outputs, the allocation input and the PLD input signal. Different variations of flop-flops can be used for flip-flops 126 and 128. For example, each flip-flop can include several other control inputs such as preset and clear. Therefore, the scope of the present invention should be determined not with reference to the above description but should, instead, be determined with reference to the appended claims, along with their full scope of equivalents.

What is claimed is:

1. In a programmable logic device (PLD), a macrocell having a plurality of inputs and at least one output, comprising:
   at least one programmable logic circuit having a plurality of inputs coupled to the plurality of macrocell inputs and an output;
   programmable logic means, having a first programmable input coupled to the output of the at least one programmable logic circuit, a second programmable input coupled to an output of another macrocell and a third programmable input coupled directly to an input/output terminal of the PLD, for programmably producing a logical combination of its inputs at at least one output; and
   output control means, coupled to the at least one output of the programmable logic means and responsive to control signals external to the macrocell, for outputting the at least one output of the programmable logic means at an output coupled to the at least one output of the macrocell,
   wherein, set up time is significantly reduced by programming the programmable logic means to receive an input signal directly from the input/output terminal of the PLD.

2. A macrocell as recited in claim 1, wherein the at least one programmable logic circuit is a four-input look-up table means for generating any logic function of the four inputs at its output.

3. A macrocell as recited in claim 1, wherein the programmable logic means comprises two NAND gates with programmable inputs.

4. A macrocell as recited in claim 1, wherein the output control means comprises two clocked registers.

5. A macrocell for use in a programmable logic device (PLD) comprising:
   a first and a second programmable look-up table each having a plurality of inputs and an output;
   first programmable logic means having a first and second inputs coupled to the first and second look-up table outputs, respectively, and a third input coupled to an output of another macrocell, for programmably producing at an output a logical combination of its inputs;
   second programmable logic means having a first input coupled to the first look-up table output, a second input coupled the output of another macrocell and a third input directly coupled to an input/output terminal of the PLD, for programmably producing at an output one of a logical combination of its first and second inputs or the input signal to the PLD;
   first register means for receiving the first programmable logic means output; and
   second register means for receiving the second programmable logic means output,
   wherein, set up time is significantly reduced by programming the programmable logic means to receive an input signal directly from the input/output terminal of the PLD.

6. A macrocell for use in a programmable logic device as recited in claim 5 further comprising selection means, having four inputs coupled respectively to the first logic means output, to an output of the first register means, to the second logic means output, and to an output of the second register means, the selection means for coupling two of its four inputs to a first and a second macrocell output, respectively.

7. A macrocell for use in a programmable logic device as recited in claim 6 wherein each one of the first and the second register means is a flip-flop.

8. A macrocell for use in a programmable logic device as recited in claim 5 wherein each one of the first and second programmable logic means is a NAND gate.

9. A macrocell for use in a programmable logic device (PLD) comprising:
   a first programmable look-up table having four inputs and an output;

a second programmable look-up table having four input and an output;

a first three-input NAND gate having a first input coupled to the first look-up table output, a second programmable input coupled to the second look-up table output, a third programmable input coupled to an output of another macrocell, and an output;

a second three-input NAND gate having a first programmable input coupled to the first look-up table output, a second programmable input coupled the output of another macrocell, a third programmable input coupled directly to an input/output terminal of the PLD, and an output;

first register means for receiving the output of the first NAND gate;

second register means for receiving the output of the second NAND gate; and selection means, having four inputs coupled respectively to the output of the first NAND gate, to an output of the first register means, to the output of the second NAND gate, and to an output of the second register means, the selection means for coupling two of its four inputs to a first and a second macrocell output, respectively, wherein, set up time is significantly reduced by programming the programmable logic means to receive an input signal directly from the input/output terminal of the PLD.

* * * * *